United States Patent
Gomez et al.

(10) Patent No.: US 9,881,712 B2
(45) Date of Patent: Jan. 30, 2018

(54) HIGHLY CRYSTALLINE ELECTRICALLY CONDUCTING POLYMERS, METHODS OF MANUFACTURE THEREOF AND ARTICLES COMPRISING THE SAME

(75) Inventors: Enrique Daniel Gomez, State College, PA (US); Kiarash Vakhshouri, III, State College, PA (US); Seung-Hyun Lee, Marlborough, MA (US); Thomas Charles Sutter, Holden, MA (US); George Lyles Athens, Midland, MI (US); Krishna Balantrapu, Marlborough, MA (US); Elissei Iagodkine, Marlborough, MA (US)

(73) Assignees: ROHM AND HAAS ELECTRONIC MATERIALS LLC, Marlborough, MA (US); DOW GLOBAL TECHNOLOGIES LLC, Midland, MI (US); THE PENN STATE RESEARCH FOUNDATION, University Park, PA (US)

(*) Notice: Subject to any disclaimer, the term of this patent is extended or adjusted under 35 U.S.C. 154(b) by 1211 days.

(21) Appl. No.: 13/554,729

(22) Filed: Jul. 20, 2012

(65) Prior Publication Data
US 2014/0021413 A1    Jan. 23, 2014

(51) Int. Cl.
*H01B 1/12*    (2006.01)
*H01L 51/00*   (2006.01)
(Continued)

(52) U.S. Cl.
CPC ............. *H01B 1/127* (2013.01); *B05D 3/007* (2013.01); *B05D 3/02* (2013.01); *B05D 3/0254* (2013.01); *H01L 51/00* (2013.01); *H01L 51/0036* (2013.01)

(58) Field of Classification Search
None
See application file for complete search history.

(56) References Cited

U.S. PATENT DOCUMENTS

| 5,546,889 A * | 8/1996 | Wakita ................... C09K 11/06 117/84 |
| 7,314,908 B2 | 1/2008 | Toth et al. |

(Continued)

FOREIGN PATENT DOCUMENTS

WO    WO2007100600 A1    9/2007

OTHER PUBLICATIONS

Vakhshouri, Kiarash, et al., "Effect of Crystallization Kinectics on Microstructure and Charge Transport of Polythiophenes"; Department of Chemical Engineering, The Pennsylvania State University, University Park, PA 16802; pp. 1-12.

(Continued)

*Primary Examiner* — Joseph D Anthony
(74) *Attorney, Agent, or Firm* — Cantor Colburn LLP

(57) ABSTRACT

Disclosed herein is a composition comprising a regioregular polyalkylthiophene and/or a regioregular poly[2,5-bis(3-alkylthiophen-2-yl)thieno(3,2-b)thiophene]; where the composition is melted and then cooled to a temperature between a melting point and a glass transition temperature of the composition; the composition having an amount of crystallinity that is at least twice the amount of crystallinity of another identical composition that is crystallized by a method that does not involve melting and cooling to a temperature between the melting point and the glass transition temperature of the identical composition.

14 Claims, 3 Drawing Sheets

(51) Int. Cl.
   B05D 3/02    (2006.01)
   B05D 3/00    (2006.01)

(56) References Cited

U.S. PATENT DOCUMENTS

| | | | |
|---|---|---|---|
| 7,829,143 | B1 | 11/2010 | Bollman |
| 8,049,209 | B2 | 11/2011 | Wu et al. |
| 9,614,158 | B2 * | 4/2017 | Sirringhaus ......... H01L 51/0034 |
| 2007/0131911 | A1 * | 6/2007 | Ito ................... H01L 51/5221 |
| | | | 252/500 |
| 2009/0181509 | A1 | 7/2009 | Pan |
| 2011/0024731 | A1 | 2/2011 | Takimiya |
| 2011/0156019 | A1 | 6/2011 | Tessler |
| 2012/0100667 | A1 | 4/2012 | Koutake |
| 2012/0273732 | A1 | 11/2012 | Jenekhe et al. |
| 2013/0149812 | A1 | 6/2013 | Newsome |
| 2015/0171331 | A1 * | 6/2015 | Iagodkine ............ H01L 51/0036 |
| | | | 427/385.5 |

OTHER PUBLICATIONS

Krischbaum et al. "Polymer-supported Sythesis of Regioregular Head-to-Tail Coupled Oligo(3-alkylthiophene)s" Synthetic Metals 119 (2001) 127-128.

Delongchamp, D.M. et al. "Molecular Basis of Mesophase Ordering in a Thiophene-Based Copolymer" Macromolecules 2008, 41, 5709-5715.

Zhao, K. et al. "A New Method to Improve Poly(3-hexyl thiophene) (P3HT) Crystalline Behavior: Decreasing Chains Entanglement to Promote Order-Disorder Transformation in Solution" Langmuir 2010, 26(1), 471-477.

Ebata et al.; "Highly Soluable [1] Benzothieno[3,2-b]benzothiophene (BTBT) Derivatives for High-Performance, Solution-Processed Organic Field-Effect Transistors"; J. Am. Chem. Soc.; 129; 2007, pp. 15732-15733.

Kline, R. Joseph, et al; "Dependence of Regioregular Poly(3-hexylthiophene) Film Morphology and Field-Effect Mobility on Molecular Weight", American Chemical Society, Mar. 12, 2005, p. 3312-3319.

Goh, Chiatzun, et al; "Molecular-weight-dependent mobilities in regioregular poly(3-hexyl-thiophene) diodes"; American Institute of Physics; Applied Physics Letters 86; Dec. 21, 2005.

McCullough, Richard D., et al.; "Regioregular Polythiophene Nanowires and Sensors", Organic Field-Effect Transistors IV, edited by Zhenan Bao, David J. Gundlach, Proc. of PSIE vol. 5940 (SPIE, Bellingham, WA 2005), pp. 1-2.

Chabinyc, Michael L.; X-Ray Scattering Study of THin Films of Poly(2,5-bis(3-alkylthiophen-2-yl)thieno[3,2b] thiophene, ACS Publications, Publication date Feb. 22, 2007, pp. 3226-3237.

Song, Mi Yeon, et al; "Effects of Carrier Mobility on Photocurrent Generation in TiO2/Poly (alkylthiophene) Photovoltaic Devices", Sep. 19, 2006; Macromolecular Research, vol. 14, No. 6, pp. 630-633.

Kim, Heejoo, et al.; "Effect of Thermal Annealing on the Performance of P3HT/PCBM Polymer Photovoltaic Cells", Journal of Korean Physical Society, vol. 48, No. 3, Mar. 2006, pp. 441-445.

Kline, R. Joseph, et al; "Controlling the Field-Effect Mobility of Regioregular Polythiophen by Changing the Molecular Weight", Advanced Materials, vol. No. 18, Sep. 16, 2003, pp. 1519-1522.

Vakhshouri, Kiarash, et al., "Effect of Crystallization Kinectics on Microstructure and Charge Transport of Polythiophenes"; Department of Chemical Engineering, The Pennsylvania State University, University Park, PA 16802; pp. 1-12, (2012).

Koch et al, "Thermal and Structural Characteristics of Oligo (3-hexylthiophene)s (3HT) n, n= 4-36," Journal of the American Chemical Society (Aug. 2013), 135, 13699-13709.

* cited by examiner

HIGHLY CRYSTALLINE ELECTRICALLY CONDUCTING POLYMERS, METHODS OF MANUFACTURE THEREOF AND ARTICLES COMPRISING THE SAME

This disclosure is related to highly crystalline electrically conducting polymers, methods of manufacture thereof and to articles comprising the same. In particular, this disclosure relates to highly crystalline electrically conducting polythiophenes and oligothiophene/polythiophene mixtures, methods of manufacture thereof and articles comprising the same.

Electrically conducting organic polymers and semiconducting organic polymers are often used in electronic devices that contain displays (e.g., computers, television sets, and the like), as well as in solar cells, and the like. They are employed in these devices in the form of thin film transistors that have flexible and non-flexible substrates. The combination of easy fabrication using methods such as ink-jet printing and roll-to-roll printing, the mechanical flexibility and modest charge mobilities of solution-processable conducting and semiconducting polymers has the potential to transform the electronics industry. One challenge to the application of polymers in digital electronics is the inherent complexity of the electrical properties of polymer films due to the semi-crystalline nature of many conjugated polymers.

Electron mobility within semiconducting conjugated polymers is dependent upon intrachain and interchain charge carrier hopping events. For example, charge carriers can hop between different chains due to the presence of intermolecular overlapping electron densities, such as π-π stacking. Consequently, the charge carrier mobility can depend on various aspects of the thin-film structure, such as the crystallinity, orientation of the crystals, electron cloud overlap in the unit cell, and the connectivity between ordered regions of the polymer.

One of the factors that limits charge transport in semiconducting polymer films are tie chains. Tie chains are polymeric chains that bridge the amorphous regions to connect adjacent crystalline regions of polymers. It is therefore desirable to increase the amount of crystallinity and to increase the number of tie chains to increase carrier mobility and the charge hopping events.

Disclosed herein is a composition comprising a regioregular polyalkylthiophene and/or a regioregular poly[2,5-bis(3-alkylthiophen-2-yl)thieno(3,2-b)thiophene]; where the composition is melted and then cooled to a temperature between a melting point and a glass transition temperature of the composition; the composition having an amount of crystallinity that is at least twice the amount of crystallinity of another identical composition that is crystallized by a method that does not involve melting and cooling to a temperature between the melting point and the glass transition temperature of the identical composition.

Disclosed herein is a method of manufacturing a thin film comprising dissolving a regioregular polyalkylthiophene or a regioregular poly[2,5-bis(3-alkylthiophen-2-yl)thieno(3,2-b)thiophene] in a solvent to form a solution; disposing the solution on a substrate; melting the regioregular polyalkylthiophene or the regioregular poly[2,5-bis(3-alkylthiophen-2-yl)thieno(3,2-b)thiophene]; and quenching the melted regioregular polyalkylthiophene or the regioregular poly[2,5-bis(3-alkylthiophen-2-yl)thieno(3,2-b)thiophene] to a temperature between a glass transition temperature and a melting point of the regioregular polyalkylthiophene or the regioregular poly[2,5-bis(3-alkylthiophen-2-yl)thieno(3,2-b)thiophene].

Figure 3:
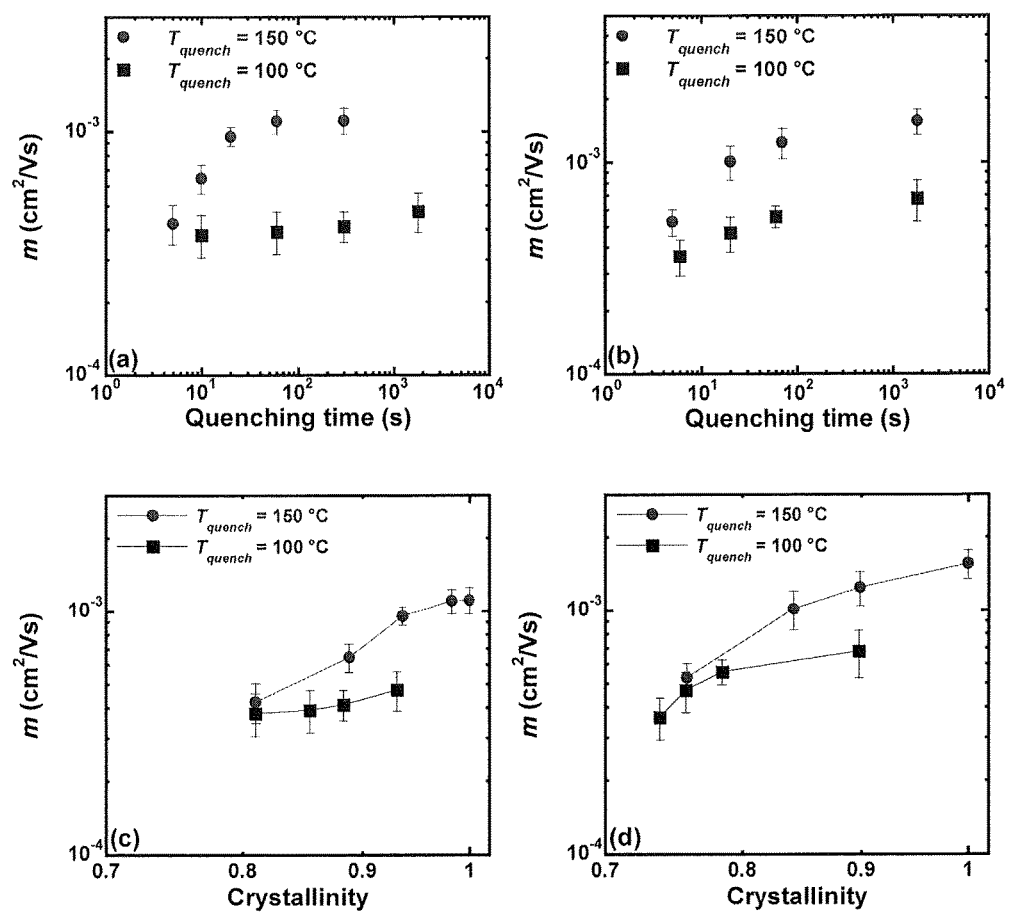

FIG. 3 represents four graphs which show the hole mobility of (a) P3HT and (b) PBTTT films quenched at two different temperatures (100 and 150° C.) as a function of quenching time. Hole mobility as a function of the relative degree of crystallinity as determined from the data in FIG. 1 for (c) P3HT and (d) PBTTT films. Crystallinities are normalized to the highest crystallinity observed for each polymer.

The term "and/or" is used herein to mean both "and" as well as "or". For example, "A and/or B" is construed to mean A, B or A and B.

The transition term "comprising" is inclusive of the transition terms "consisting essentially of" and "consisting of" and can be interchanged for "comprising".

Disclosed herein are electrically conducting or semiconducting polymeric compositions that comprise regioregular polythiophenes. In one embodiment, the regioregular polythiophenes comprise regioregular poly(alkylthiophenes) (PAT), regioregular poly[2,5-bis(3-alkylthiophen-2-yl)thieno(3,2-b)thiophene] (PBTTT), or combinations comprising at least one of the foregoing regioregular polythiophenes. In an exemplary embodiment, the regioregular poly(alkylphenes) comprises regioregular poly(3-hexylthiophenes) (P3HT) while the regioregular poly[2,5-bis(3-alkylthiophen-2-yl)thieno(3,2-b)thiophene] comprises poly[2,5-bis(3-hexadecylthiophen-2-yl)thieno(3,2-b)thiophene].

Disclosed herein, too, is a method for increasing the crystalline content of electrically conducting or semiconducting polymeric compositions that comprise regioregular polythiophenes. In an exemplary embodiment, the method comprises melting the polymer films and subsequently quenching the melted polymer film to different temperatures below the melting temperature. In one embodiment, the polymer films are quenched to a temperature that is between the glass transition temperature and the melting temperature of the composition. They are annealed to this temperature for time periods of 5 to 1000 seconds. In an exemplary embodiment, the polymer films are quenched to temperatures that are 100 to 175° C. below the melting temperature, following which they are annealed at these temperatures for time periods of 5 to 1000 seconds.

The percent crystallinity obtained by this method is at least 50% higher than that reported for other methods of crystallization. In one embodiment, the regioregular polythiophenes have a crystallinity that is at least twice the amount of crystallinity of another identical composition that is crystallized by a method that does not involve melting and cooling to a temperature between the melting point and the glass transition temperature of the identical composition. These highly crystalline samples display high levels of electron mobility, which makes them useful in thin film transistors. Because the conducting and semiconducting polymers are flexible they can be disposed on flexible or non-flexible substrates, thereby making them useful in a variety of different applications.

The electrically conducting or semiconducting polymeric compositions comprise regioregular polythiophene oligomers; regioregular polythiophene homopolymers; polythiophene copolymers that have at least one block that comprises regioregular polythiophene oligomers, polythiophene homopolymers or polythiophene ionomers; polythiophene ionomers, or combinations thereof. The regioregular polythiophenes can be copolymerized with other electrically conducting polymers or with other electrically insulating polymers. The regioregular polythiophene copolymers can be block copolymers, alternating copolymers, alternating block copolymers, star block copolymers, or a combination comprising at least one of the foregoing polythiophene copolymers.

In one embodiment, the homopolymers generally have a number average molecular weight of greater than or equal to 10,000 grams per mole, while oligomers have number average molecular weights less than 10,000 grams per mole.

Regioregular polymers are those in which each repeat unit is derived from the same isomer of the monomer. In an exemplary embodiment, the regioregular polythiophenes are derived from the polymerization of 3-substituted thiophenes or alternatively by substituting the polythiophene in the 3-position. The asymmetry of 3-substituted thiophenes results in three possible couplings when two monomers are linked between the 2- and the 5-positions. They are 2,5′ or head-tail (HT) coupling, 2,2′ or head-head (HH) coupling or 5,5′ or tail-tail (TT) coupling. The three couplings result in 4 distinct triads as shown in the formulas (I) through (IV) below. Structure (I) below has HT-HT couplings

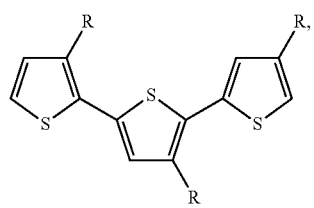

structure (II) below has HH-TH couplings

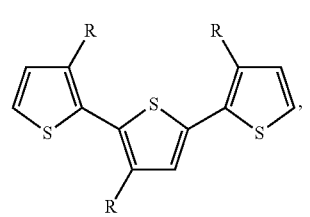

structure (III) below has HH-TT couplings

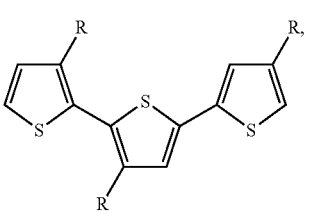

and structure (IV) has TT-HT couplings

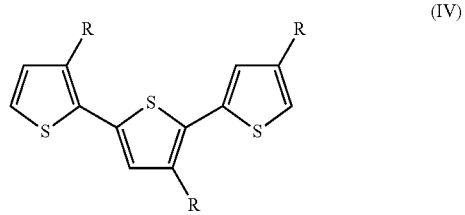

where R is an alkyl group having 2 to 20 carbon atoms, an alkylenealkoxy group having 2 to 20 carbons, a polyalkylene oxide group, an alkoxy group having 1 to 20 carbon atoms or an aralkyl group having 7 to 20 carbon atoms. Suitable polyalkyleneoxide groups are those of the formula —$(R^3O)_p$—, where $R^3$ is a $(C_2$-$C_6)$alkyl group and p is 1 to 100, preferably 1 to 50. Exemplary polyalkylene oxide groups include polyethyleneoxide groups, polypropyleneoxide groups, polybutyleneoxide groups, or mixtures thereof.

In one embodiment, a regioregular polythiophene can have all HH structures, all TT structures, all HT or all TH structures. When the HH or TT structures are combined with HT or TH structures as shown in the polythiophene, it is desirable to have at least a first block comprising one of the HH, TT, HT or TH structures copolymerized with a second block of comprising one of the HH, TT, HT or TH structures, where at least one of the blocks has at least 5 or more repeat units and where the structures included in the first block not identical with the structures included in the second block.

In one embodiment, the regioregular polythiophenes are polyalkylthiophenes that have the structure of formula (V):

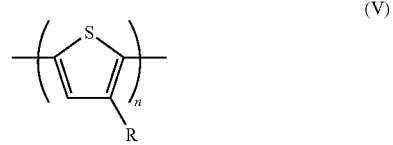

where R is an alkyl group having 2 to 20 carbon atoms, an alkylenealkoxy group having 2 to 20 carbons, a polyalkylene oxide group, an alkoxy group having 1 to 20 carbon atoms or an aralkyl group having 7 to 20 carbon atoms. Suitable polyalkyleneoxide groups are those of the formula —$(R^3O)_p$—, where $R^3$ is a $(C_2$-$C_6)$alkyl group and p is 1 to 100, preferably 1 to 50. Exemplary polyalkylene oxide groups include polyethyleneoxide groups, polypropyleneoxide groups, polybutyleneoxide groups, or mixtures thereof. In one exemplary embodiment, R is an alkyl group having 2 to 15 carbon atoms, preferably 3 to 10 carbon atoms. In another exemplary embodiment, R is a hexyl group and the regioregular polyalkylthiophene is poly(3-hexylthiophene). In the formula (V), n is 5 to 10,000.

As noted above, the polyalkylthiophene of formula (V) can be copolymerized with other electrically insulating polymers to form the electrically conducting or semiconducting polymeric compositions. Examples of other electrically insulating polymers are polyacetals, polyolefins, polyacrylics, polycarbonates, polystyrenes, polyesters, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, or the like, or a combination comprising at least one of the foregoing electrically insulating polymers.

In one embodiment, the regioregular polythiophenes may be block copolymers of polyalkylthiophenes that have the structures of formula (VI):

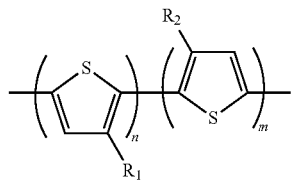

(VI)

where $R_1$ and $R_2$ can be the same or different and are independently a hydrogen, an alkyl group having 2 to 20 carbon atoms, an alkylenealkoxy group having 2 to 20 carbons, a polyalkylene oxide group, an alkoxy group having 1 to 20 carbon atoms or an aralkyl group having 7 to 20 carbon atoms. Suitable polyalkyleneoxide groups are those of the formula —$(R^3O)_p$—, where $R^3$ is a $(C_2$-$C_6)$alkyl group and p is 1 to 100, preferably 1 to 50. Exemplary polyalkylene oxide groups include polyethyleneoxide groups, polypropyleneoxide groups, polybutyleneoxide groups, or mixtures thereof. In the formula (VI), n is 5 to 1000 and m is 5 to 1000. The ratio of n to m can vary from 100:1 to 5:1 and from 1:5 to 1:100. The block copolymer of formula (VI) can be a diblock, triblock or an alternating block copolymer. In one exemplary embodiment, $R_1$ and $R_2$ are hexyl groups. In another exemplary embodiment, $R_1$ is a hexyl group while $R_2$ is hydrogen.

In yet another embodiment, the regioregular polythiophenes may be alternating copolymers of polyalkylthiophenes that have the structures of formula (VII):

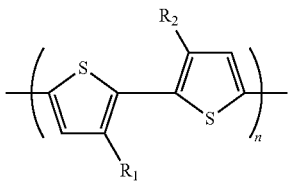

(VII)

where $R_1$ and $R_2$ can be the same or different and are independently a hydrogen, an alkyl group having 2 to 20 carbon atoms, an alkylenealkoxy group having 2 to 20 carbons, a polyalkylene oxide group, an alkoxy group having 1 to 20 carbon atoms or an aralkyl group having 7 to 20 carbon atoms. Suitable polyalkyleneoxide groups are those of the formula —$(R^3O)_p$—, where $R^3$ is a $(C_2$-$C_6)$alkyl group and p is 1 to 100, preferably 1 to 50. Exemplary polyalkylene oxide groups include polyethyleneoxide groups, polypropyleneoxide groups, polybutyleneoxide groups, or mixtures thereof. In the formula (VII), n is 5 to 10,000. In one exemplary embodiment, $R_1$ and $R_2$ are hexyl groups. In another exemplary embodiment, $R_1$ is a hexyl group while $R_2$ is hydrogen.

In another embodiment, the electrically conducting or semiconducting polymeric compositions comprise regioregular poly[2,5-bis(3-alkylthiophen-2-yl)thieno(3,2-b)thiophene] having the structure of formula (VIII)

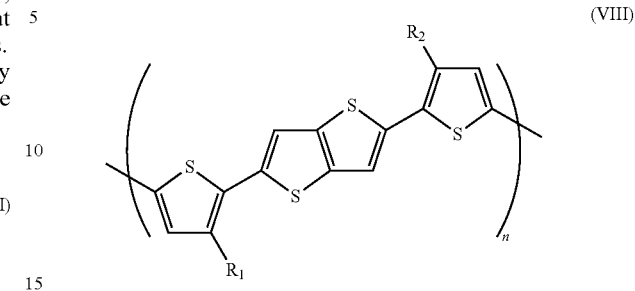

(VIII)

where $R_1$ and $R_2$ can be the same or different and are independently a hydrogen, an alkyl group having 2 to 20 carbon atoms, an alkylenealkoxy group having 2 to 20 carbons, a polyalkylene oxide group, an alkoxy group having 1 to 20 carbon atoms or an aralkyl group having 7 to 20 carbon atoms. Suitable polyalkyleneoxide groups are those of the formula —$(R^3O)_p$—, where $R^3$ is a $(C_2$-$C_6)$alkyl group and p is 1 to 100, preferably 1 to 50. Exemplary polyalkylene oxide groups include polyethyleneoxide groups, polypropyleneoxide groups, polybutyleneoxide groups, or mixtures thereof. In the formula (VIII), n is 5 to 10,000. In one exemplary embodiment, $R_1$ and $R_2$ are hexyldecyl groups. In another exemplary embodiment, $R_1$ is a hexadecyl group or a hexyldecyl group while $R_2$ is hydrogen.

It is desirable for the regioregular polythiophene or the regioregular poly[2,5-bis(3-alkylthiophen-2-yl)thieno(3,2-b)thiophene] to have a number average molecular weight of 10,000 to 100,000 grams per mole, preferably 25,000 to 75,000 grams per mole, and more preferably 45,000 to 55,000 grams per mole.

In one embodiment, in one method of manufacturing the highly crystalline electrically conducting or semiconducting polymeric compositions, the regioregular polythiophene or the regioregular poly[2,5-bis(3-alkylthiophen-2-yl)thieno(3,2-b)thiophene] is first dissolved in a solvent at an appropriate temperatures. It is desirable for the solvents to not contain any water, i.e., for the solvent to be anhydrous.

Suitable solvents for solubilizing the regioregular polythiophene or the regioregular poly[2,5-bis(3-alkylthiophen-2-yl)thieno(3,2-b)thiophene] are aromatic or aliphatic hydrocarbons; aliphatic carboxylic esters; chlorohydrocarbons, aliphatic or araliphatic ethers, or a combination comprising at least one of the foregoing solvents. Examples of effective solvents are chlorobenzene, dicholorbenzene, trichlorobenzene, chloroform, toluene, xylene, tetrahydrofuran, dichloromethane, or the like, or a combination comprising at least one of the foregoing solvents.

The weight percent of the regioregular polythiophene and/or the regioregular poly[2,5-bis(3-alkylthiophen-2-yl)thieno(3,2-b)thiophene] in the solvent is 0.1 to 10 wt %, based on the total weight of the regioregular polythiophene and/or the regioregular poly[2,5-bis(3-alkylthiophen-2-yl)thieno(3,2-b)thiophene] and the solvent.

The mixture of the regioregular polythiophene and/or the regioregular poly[2,5-bis(3-alkylthiophen-2-yl)thieno(3,2-b)thiophene] and the solvent is stirred at room temperature for a period of 2 to 30 hours, preferably 4 to 30 hours, and more preferably 8 to 14 hours, followed by stirring at an elevated temperature of 60 to 100° C. for 5 to 120 minutes prior to casting.

The elevated temperature is generally below the vaporization temperature of the solvent and below the degradation temperature of the regioregular polythiophene or the regioregular poly[2,5-bis(3-alkylthiophen-2-yl)thieno(3,2-b)thiophene].

The regioregular polythiophene and/or the regioregular poly[2,5-bis(3-alkylthiophen-2-yl)thieno(3,2-b)thiophene] now dissolved the solvent is then disposed on a substrate and the solvent is allowed to evaporate. The polymer may be disposed on the substrate by dip coating, spray coating, spin casting, curtain coating, doctor-blading, or a combination comprising at least one of the foregoing methods. In one embodiment, the regioregular polythiophene and/or the regioregular poly[2,5-bis(3-alkylthiophen-2-yl)thieno(3,2-b)thiophene] is disposed on a substrate by spin casting. The spin casting was conducted at a speed of 500 to 5,000 revolutions per minute, preferably 750 to 1,250 revolutions per minute for a time period of 30 seconds to 5 minutes, preferably 45 seconds to 90 seconds.

The substrate is a silicon substrate, a quartz substrate, a polymeric substrate, or the like. The substrate with the spun cast film was then heated to a temperature of greater than the melting point of the regioregular polythiophene and/or the regioregular poly[2,5-bis(3-alkylthiophen-2-yl)thieno(3,2-b)thiophene] for a period of time of 30 seconds to 5 minutes, preferably 45 seconds to 2 minutes to melt the regioregular polythiophene and/or the regioregular poly[2,5-bis(3-alkylthiophen-2-yl)thieno(3,2-b)thiophene].

The melted spun cast regioregular polythiophene and/or the regioregular poly[2,5-bis(3-alkylthiophen-2-yl)thieno(3,2-b)thiophene] is then quenched to a temperature between the glass transition temperature and the melting temperature of the respective polythiophene. For poly(3-hexylthiophene) the glass transition temperature is 0° C., while the melting temperature is 230° C. The melted spun cast regioregular polythiophene and/or the regioregular poly[2,5-bis(3-alkylthiophen-2-yl)thieno(3,2-b)thiophene] is then quenched to a temperature of 50 to 175° C., preferably 75 to 160° C. below the melting point of the regioregular polythiophene or the regioregular poly[2,5-bis(3-alkylthiophen-2-yl)thieno(3,2-b)thiophene]. The heating and quenching of the regioregular polythiophene and/or the regioregular poly[2,5-bis(3-alkylthiophen-2-yl)thieno(3,2-b)thiophene] is performed in an atmosphere that comprises an inert gas or a combination of inert gases. The quenching is conducted at a rate of 20° C. to 40° C. per second.

Crystalline thin films manufactured from the regioregular polythiophenes and/or the regioregular poly[2,5-bis(3-alkylthiophen-2-yl)thieno(3,2-b)thiophene]s are used in thin film transistors and field effect transistors. In one embodiment, these thin films can be disposed upon a substrate that contains a source and a drain electrode to form the thin film transistor. Thin film transistors manufactured by using the regioregular polythiophenes and/or the regioregular poly[2,5-bis(3-alkylthiophen-2-yl)thieno(3,2-b)thiophene]s may be used in display applications, solar cells, photovoltaic cells and the like.

The method of manufacturing the crystalline film is advantageous because it is inexpensive, produces a higher level of crystallinity than other known methods and may be used in low-power consumption electronic devices. This method of manufacturing the crystalline films produces crystalline levels that are least 50% greater, preferably at least 75% greater and more specifically at least 100% greater than other similar films that are manufactured by methods that do not involve melting followed by quenching and annealing.

The invention is exemplified by the following non-limiting example.

EXAMPLE 1

This example was conducted to demonstrate the method of manufacturing highly crystalline samples and to compare the crystallinity with other similar crystalline products available in the commercial and scientific literature. This example also demonstrates the high levels of crystallinity that can be achieved using the method of crystallization described above. Electrical properties were also measured using a bottom gate field effect transistor that is detailed below.

Solutions of regioregular poly(3-hexylthiophene-2,5-diyl) (P3HT) (96% H-T regioregular, $M_n$ (number average molecular weight)=50 kg/mol, polydispersity=2.0 commercially available from Merck) and regioregular poly[2,5-bis(3-hexadecylthiophen-2-yl)thieno(3,2-b)thiophene] (PBTTT) ($M_n$=50 kg/mol, polydispersity=1.9 commercially available from Merck) were made with anhydrous chlorobenzene (Sigma-Aldrich) in a $N_2$ glove box.

Solutions made with P3HT were stirred for a minimum of 12 hours and heated to 75° C. for 30 seconds prior to use to ensure dissolution. For PBTTT dissolved in chlorobenzene, solutions were heated to 90° C. for 5 minutes after stirring for 12 hours. Films were spun from 10 mg/mL solutions at 1000 rpm for 1 min onto a substrate. The substrate comprised silicon (Si) wafer substrates.

X-ray diffraction (XRD) experiments were used to measure the relative crystallinity. Silicon (100) wafer substrates (commercially available from Silicon Sense) were cleaned via sonication in acetone and isopropanol alcohol each for 20 minutes followed by 10 minutes of UV-O cleaning. X-ray measurements were performed at the Material Characterization Laboratory at the Pennsylvania State University with Rigaku DMAX-Rapid Micro diffractometer using a 2-dimensional detector. The x-ray wavelength, $\lambda$, was 1.54 Å. Rocking curves were obtained by rocking the sample (+/−0.2°) during data acquisition and keeping track of the (100) peak for P3HT and the (200) peak for PBTTT samples. Intensities as a function of azimuthal angle (A) were obtained by integrating over a +/−0.019 Å$^{-1}$ q window ($q=4\pi \sin(\theta/2)/\lambda$). A linear background was subtracted from the rocking curve data using intensities away from the Bragg peak of interest.

Bottom-contact, bottom-gate field-effect transistors were made using heavily doped p-type silicon wafers as the gate electrodes with a 300 nm-thick thermally grown silica ($SiO_2$) layer as the gate dielectric (capacitance=10.6 nF/Cm$^2$ commercially available from Process Specialties). Wafers were cleaned through sonication for 20 minutes in acetone followed by sonication in isopropanol for 20 minutes. Gold source and drain electrodes (with a thickness of ~100 nanometers (nm) each) were deposited by using conventional double-layer lithography with channel widths of 220 micrometers (μm) and lengths of 20 μm.

Samples for xray diffraction or transistor measurements (after spin casting) were placed on a calibrated digital hot-plate with the temperature set at 240° C. for 1 minute to melt the spun cast film. The samples were immediately placed (quenched) on another hot-plate with the temperature set at either 100 or 150° C. (crystallization temperatures) and annealed as a function of time (crystallization time). The time necessary to transfer the films was less than 2 seconds. All dissolution, spin casting, thermal annealing and electrical measurements were performed in a nitrogen glove-box in an inert atmosphere of nitrogen.

Figure 1:
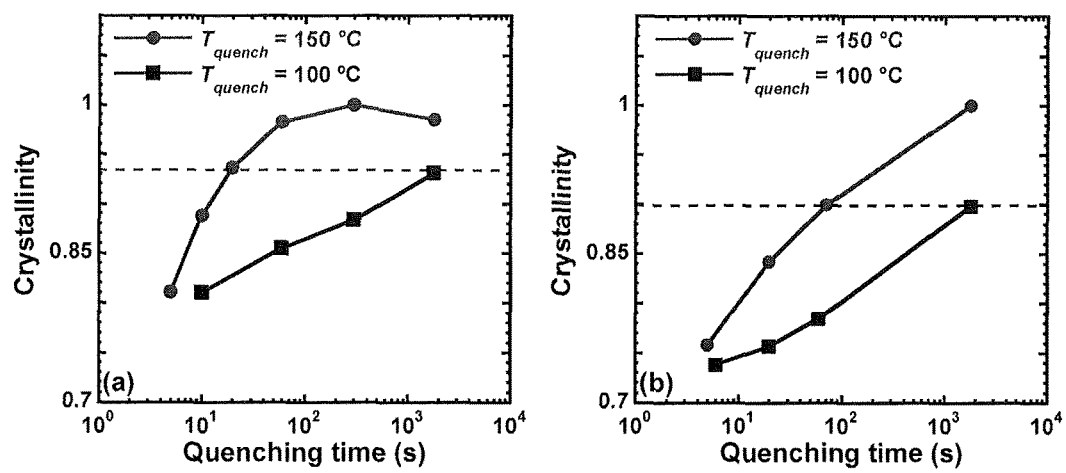
FIG. 1 is a graph of crystallinity versus quenching time showing the isothermal crystallization of (a) regioregular poly(3-hexylthiophene-2,5-diyl) (P3HT) and (b) poly[2,5-bis(3-hexadecylthiophen-2-yl)thieno(3,2-b)thiophene] (PBTTT) at two different quenching (crystallization) temperatures (100 and 150° C. respectively)

The crystallization kinetics of P3HT and PBTTT thin films were determined by measuring rocking curves of the (100) peak for P3HT and (200) peak for PBTTT samples. After a linear background subtraction, integrated peak intensities represent the crystallinity of the sample. FIG. 1 shows the isothermal crystallization of (a) P3HT and (b) PBTTT at two different quenching (crystallization) temperatures (100 and 150° C. respectively). Crystallinities are normalized to the highest crystallinity of each polymer obtained in the experiments. Results show that for both P3HT and PBTTT a higher quenching temperature results in faster crystallization rates and higher crystallinity.

Without being limited to temperature, crystal growth rate in polymers is not a monotonic function of temperature. At low temperatures, chain mobility/diffusion is limited (diffusion-controlled), whereas at high temperatures the nucleation rate is suppressed (nucleation-controlled). The late stages of P3HT and PBTTT crystallization are diffusion limited. Therefore, increasing the temperature of the quench results in higher chain motion and consequently higher crystalline growth rates.

The dotted lines in the FIG. 1 illustrate that for two different crystallization rates, the same crystallinity can be achieved by varying the quenching time. This enables comparison between samples with equal crystallinity but different processing history.

Figure 2:
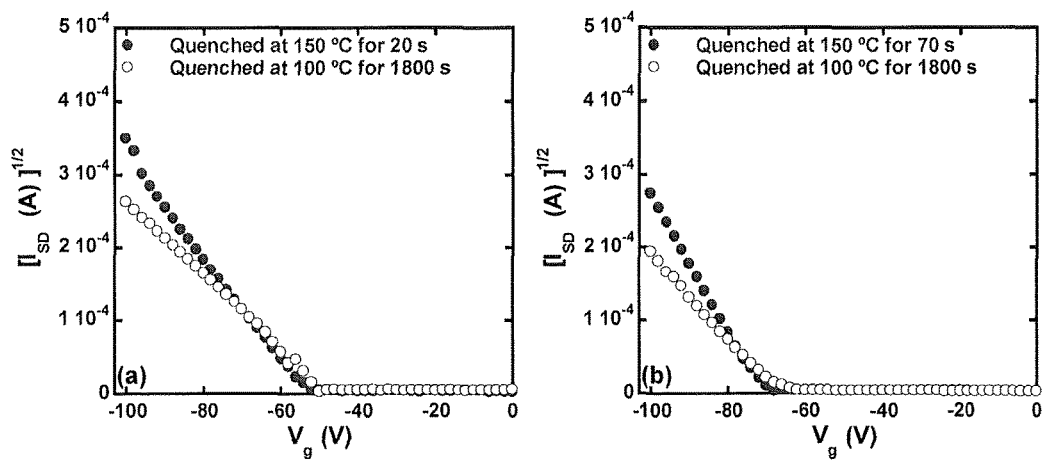
FIG. 2 is a graph showing transfer characteristics of source-drain current versus gate voltage for TFTs prepared from P3HT and PBTTT.

As detailed above, bottom-contact, bottom-gate thin film transistors were fabricated to examine the effect of varying the crystallization kinetics on charge transport through P3HT and PBTTT. FIG. 2 shows transfer characteristics of thin film transistors prepared from P3HT and PBTTT. In each case, the crystallization temperature and time were carefully controlled so that the active layers have equal crystallinity. FIG. 2 demonstrates that for both P3HT and PBTTT devices the current level, and consequently the mobility, is higher for samples where the crystallization rate was higher.

FIG. 3 summarizes the hole mobility (extracted from thin film transistors measurements at saturation, $V_{SD}=-50$ V) of P3HT and PBTTT thin films for fast and slow crystallization kinetics as a function of quenching time and crystallinity. In general, the hole mobility increases with quenching time and crystallinity. In addition, hole mobilities are always higher for faster crystallization rates for both P3HT and PBTTT devices. Without being limited to theory, it is believed that the correlation between crystallization kinetics and charge mobility is due to variation in the interconnectivity between crystallites and the number of tie chains. Faster crystallization kinetics of the active layer leads to more tie chains between crystalline regions and consequently higher charge mobilities in devices.

EXAMPLE 2

This example details the crystallinity of polyalkylthiophene samples manufactured by the present method and those manufactured by other methods (comparative examples) described in the literature.

These results are shown in the Tables 1 and 2 below. The results are normalized to the sample that was spun cast, melted at 240° C. and quenched to 150° C. for 5 minutes. The sample that was spun cast, melted at 240° C. and quenched to 150° C. for 5 minutes had the highest crystallinity measured for any samples disclosed herein. The crystallinity of all other samples were ratioed against the crystallinity of this particular sample and the results are shown in the Table 1. Table 1 lists the reference from which the data was acquired as well as the type of treatment that the sample was subjected to and the solvent from which the samples were precipitated. The results (in Table 1) show that the level of crystallinity in comparative samples was at least 50% less than the crystallinity developed in the samples manufactured by the method disclosed herein.

Table 2 depicts the highest levels of crystallinity for P3HT samples that were precipitated from different solvents and annealed at a temperature of 150° C. for unusually long time periods to enhance the crystallinity. These samples were not heated to their melting points prior to annealing them at 150° C. for the time periods shown in the Table 2. Even after long annealing times, the samples shown in Table 2 only achieve 63% of the crystallinity that was displayed by the P3HT samples, which are first melted at 240° C. and then quenched to 150° C. for 5 minutes.

TABLE 1

| Principal Investigator | Publication | Material | Annealing Temperature (° C.) | Annealing Time | Casting Solvent* | Normalized Crystallinity** |
|---|---|---|---|---|---|---|
| S. Grigorian | Journal of Applied Polymer Science, 125(3), (2012), pp 2335-2341 | P3HT | 100, 150, 200 | 30 min | CF | 0.29 |
| S. Grigorian | Solar Energy Materials & Solar Cells, 97, (2012), pp 109-118 | P3HT | 50, 75, 100, 125 | N.A. | TL | |
| J. Abad | Chem. Mater., 16, (2004), pp 4772-4776 | P3HT | 100, | 10 hours | TCB, CF | |
| H. Sirringhaus | PHYSICAL REVIEW B 74, (2006), pp 115318 | P3HT | 100, | 10 hours | TCB, CF | |
| H. Sirringhaus | Nature materials 5(3), (2006), pp 222-228 | P3HT | 150, | 30 min | CF | 0.29 |
| M. D. McGehee | Macromolecules, 38, (2005), pp 3312-3319 | P3HT | 125, | 60 min | CF, Xylene | |
| M. D. McGehee | phys. stat. sol. (a) 205 (3), (2008), pp 488-496 | P3HT | 120, 150, 180 | 120 min | THF | |
| S. Joshi | Advanced Functional Materials, 14(8), (2004), pp 757-764 | P3HT | 150, | 5 min | CF | 0.29 |
| D. Neher | Advanced Functional Materials, 14(8), (2004), pp 757-764 | P3HT | 150, | 5 min | DCB | 0.48 |

TABLE 1-continued

| Principal Investigator | Publication | Material | Annealing Temperature (° C.) | Annealing Time | Casting Solvent* | Normalized Crystallinity** |
|---|---|---|---|---|---|---|
| D. Neher | Fibers and Polymers, 1(1), 2000, pp 25-31 | P3HT | 120, 150, 170, 240 | 30 min | THF | |
| C Seoul | Adv. Funct. Mater. 2010, 20, pp 3519-3529 | P3HT | 160, 170, 180, 190, 200, 210, 220 | 45 min | CF | |
| Zhenan Bao | Macromolecules, 44, (2011), pp 2725-2734 | P3HT | 140, | 50 min | CB | |
| S. Lilliu | J Mater Sci 44, (2009), pp 3192-3197 | P3HT | 110, 150 | 30 min | CF | 0.29 |
| G. F. Malgas | Adv. Funct. Mater., 18, (2008) pp 2373-2380 | P3HT | 140, 150 | 30 min | CB | 0.48 |
| A. M. Ballantyne | Nano Lett, 11, (2011) pp 2071-2078 | P3HT | 150, | 5 min | CB | 0.43 |

*CF = chloroform; TL = toluene; CB = chlorobenzene; TCB = trichlorobenzene; DCB = dichlorobenzene
**Crystallinity normalized to the crystallinity obtained for the sample which was melted at 240° C. and then quenched to 150° C. for 5 minutes.

TABLE 2

| Material | Annealing Temperature (° C.) | Annealing Time | Casting Solvent* | Normalized Crystallinity** |
|---|---|---|---|---|
| P3HT | 150° C. | 720 min | CF | 0.34 |
| P3HT | 150° C. | 720 min | CB | 0.52 |
| P3HT | 150° C. | 360 min | DCB | 0.57 |
| P3HT | 150° C. | 720 min | TCB | 0.63 |

*CF = chloroform; CB = chlorobenzene; TCB = trichlorobenzene; DCB = dichlorobenzene
**Crystallinity normalized to the crystallinity obtained for the sample which was melted at 240° C. and then quenched to 150° C. for 5 minutes.

What is claimed is:

1. A melted and cooled composition comprising:
a composition comprising a regioregular polythiophene and/or a regioregular poly[2,5-bis(thiophen-2-yl)thieno(3,2-b)thiophene];
where the regioregular polythiophene and the regioregular poly[2,5-bis(thiophen-2-yl)thieno(3,2-b)thiophene] each have a number average molecular weight of 45,000 to 55,000 grams per mole; and
where the composition is melted and then cooled to a temperature between a melting point and a glass transition temperature of the composition to form the melted and cooled composition; the melted and cooled composition having an amount of crystallinity that is at least twice the amount of crystallinity of another identical composition that is crystallized by a method that does not involve melting and cooling to a temperature between the melting point and the glass transition temperature of the identical composition.

2. The melted and cooled composition of claim 1, where the regioregular polythiophenes have the structure of formula (V):

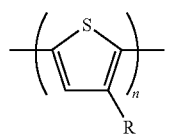

(V)

where R is an alkyl group having 2 to 20 carbon atoms, an alkylenealkoxy group having 2 to 20 carbons, a polyalkylene oxide group of the formula —(R$^3$O)$_p$—, where R$^3$ is a (C$_2$-C$_6$)alkyl group and p is 1 to 100, an alkoxy group having 1 to 20 carbon atoms or an aralkyl group having 7 to 20 carbon atoms, and where n is 5 to 10,000.

3. The melted and cooled composition of claim 2, where the regioregular polythiophene is poly(3-hexylthiophene).

4. The melted and cooled composition of claim 1, where the regioregular polythiophenes have the structures of formula (VI):

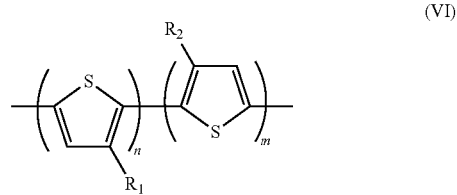

(VI)

where R$_1$ and R$_2$ are independently a hydrogen, an alkyl group having 2 to 20 carbon atoms, an alkylenealkoxy group having 2 to 20 carbons, a polyalkylene oxide group of the formula —(R$^3$O)$_p$—, where R$^3$ is a (C$_2$-C$_6$)alkyl group and p is 1 to 100, an alkoxy group having 1 to 20 carbon atoms or an aralkyl group having 7 to 20 carbon atoms, and where n is 5 to 1000 and m is 5 to 1000 and where the ratio of n tom can vary from 100:1 to 5:1 and from 1:5 to 1:100.

5. The melted and cooled composition of claim 4, where R$_1$ and R$_2$ are hexyl groups.

6. The melted and cooled composition of claim 4, where R$_1$ is a hexyl group while R$_2$ is hydrogen.

7. The melted and cooled composition of claim 1, where the regioregular polythiophenes have the structure of formula (VII):

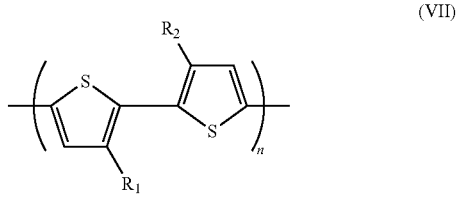

(VII)

where R$_1$ and R$_2$ are independently a hydrogen, an alkyl group having 2 to 20 carbon atoms, an alkylenealkoxy group having 2 to 20 carbons, a polyalkylene oxide group of the formula —(R$^3$O)$_p$—, where R$^3$ is a (C$_2$-C$_6$)alkyl group and p is 1 to 100, an alkoxy group having 1 to 20 carbon atoms or an aralkyl group having 7 to 20 carbon atoms and where n is 5 to 10,000.

8. The melted and cooled composition of claim 7, where $R_1$ and $R_2$ are hexyl groups.

9. The melted and cooled composition of claim 7, where $R_1$ is a hexyl group while $R_2$ is hydrogen.

10. The composition of claim 1, where the regioregular poly[2,5-bis(thiophen-2-yl)thieno(3,2-b)thiophene] has the structure of formula (VIII)

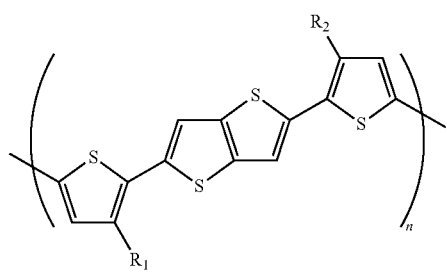

(VIII)

where $R_1$ and $R_2$ can be the same or different and are independently a hydrogen, an alkyl group having 2 to 20 carbon atoms, an alkylenealkoxy group having 2 to 20 carbons, a polyalkylene oxide group of the formula —$(R^3O)_p$—, where $R^3$ is a $(C_2$-$C_6)$alkyl group and p is 1 to 100, an alkoxy group having 1 to 20 carbon atoms or an aralkyl group having 7 to 20 carbon atoms, and where n is 5 to 10,000.

11. The composition of claim 10, where $R_1$ and $R_2$ are hexadecyl groups or hexyldecyl groups.

12. The composition of claim 10, where $R_1$ is a hexyldecyl group or a hexadecyl group while $R_2$ is hydrogen.

13. The composition of claim 10, where the polythiophene can be copolymerized with other electrically insulating polymers or with other electrically conducting or semiconducting polymers.

14. An article manufactured from the melted and cooled composition of claim 1.

* * * * *